United States Patent [19]
Barna et al.

[11] Patent Number: 5,978,282
[45] Date of Patent: Nov. 2, 1999

[54] LOW POWER LINE SYSTEM AND METHOD

[75] Inventors: Stephen K. Barna, Richardson; Bryan D. Sheffield, Allen, both of Tex.

[73] Assignee: Texas Instruments Incorporated, Dallas, Tex.

[21] Appl. No.: 09/049,838

[22] Filed: Mar. 27, 1998

Related U.S. Application Data

[60] Provisional application No. 60/042,684, Apr. 3, 1997.

[51] Int. Cl.$^6$ .................................................. G11C 16/04
[52] U.S. Cl. ............................... 365/189.08; 365/230.06; 365/188
[58] Field of Search ..................................... 395/425, 495; 365/230.06, 189.08, 188, 230.03, 203

[56] References Cited

U.S. PATENT DOCUMENTS

| | | | |
|---|---|---|---|
| 535,427 | 10/1895 | Fujishima et al. | 395/425 |
| 5,111,386 | 5/1992 | Fujishima et al. | 395/425 |
| 5,721,862 | 2/1998 | Sartore et al. | 395/445 |
| 5,808,959 | 9/1998 | Kengeri et al. | 365/233 |

*Primary Examiner*—David Nelms
*Assistant Examiner*—Thong Le
*Attorney, Agent, or Firm*—Robby T. Holland; Richard L. Donaldson

[57] ABSTRACT

The low power data line and method may comprise a line (30, 102) connecting a plurality of devices (60, 104) to an output (32, 104). The devices (60, 104) may be independently accessed to provide data to the output (32) along the line (30, 102). A switch (40, 120) may be disposed in the line (30, 102) to selectively disconnect a segment (52, 132) of the line (30, 102) connected to at least one of the devices (60, 104) from the output (32).

22 Claims, 2 Drawing Sheets

LOW POWER LINE SYSTEM AND METHOD

This is a Non Provisional application filed under 35 USC 119(e) and claims priority of prior provisional, Ser. No. 60/042,684 of inventor Barna, et al., filed Apr. 3, 1997.

TECHNICAL FIELD OF THE INVENTION

This invention relates generally to data lines, and more particularly to a low power line system and method.

BACKGROUND OF THE INVENTION

Data lines connecting a device to an output are well known. To reduce the number of data lines in a system, a number of devices may be connected to a shared line. The devices may be independently driven to selectively provide requested data along the shared line. Accordingly, the devices may communicate with one another or with an output along the shared line.

Shared lines typically suffer performance degradation due to resistance and capacitance (RC) delay associated with driving the line rail-to-rail each time a device is accessed. The higher capacitance (C) of a shared line requires more power to be used in charging or discharging the line and increases the delay. The higher resistance (R) of the shared line also serves to increase the delay.

SUMMARY OF THE INVENTION

Accordingly, a need has arisen in the art for an improved line system. The present invention provides a low power line system and method that substantially reduce or eliminate problems associated with prior line systems.

In accordance with the present invention, a low power line system may comprise a line connecting a plurality of devices to an output. The devices may be independently accessed to provide data to the output along the line. A switch may be disposed in the line to selectively disconnect a segment of the line connected to at least one of the devices from the output.

More specifically, in accordance with one embodiment of the present invention, a switching system may be coupled to the switch. The switching system may control the switch to selectively disconnect the segment of the line from the output. In this embodiment, the segment may be connected to a non-accessed device. An accessed device may remain connected to the output along the data line.

In accordance with a specific embodiment of the present invention, the lower power line system may be used in connection with a memory device. The memory device may comprise a first line connecting a plurality of memory cells to an output. A plurality of second lines may each be operable to access one of the memory cells to provide data to the output along the first line. A switch may be disposed in the first line to selectively disconnect a segment of the first line connected to at least one of the memory cells from the output. In this embodiment, frequently accessed data may be stored in memory cells proximate to the output. Infrequently accessed data may be stored in memory cells distant of the output.

In accordance with another specific embodiment of the present invention, the low power line system may be used in connection with a computing device. The computing device may comprise a data bus connecting a plurality of devices. Each device may be independently accessed to provide data to another device along the data bus. A switch may be disposed in the data bus to selectively disconnect a segment of the data bus connected to at least one of the devices from the output. The devices may comprise a central processing unit, a cache memory and other devices such as disk storage, a network connection, an extension, and the like. In this embodiment, devices frequently providing data to one another may be connected to the data bus proximate to one another. Additionally, a plurality of frequently accessed devices may be connected to a central segment of the data bus. An infrequently accessed device may be connected to the data bus outwardly of the central segment of the data bus.

Technical advantages of the present invention include providing an improved line system and method. In particular, a switch may be disposed in a data line to disconnect a segment of the line from the output. This segment may be connected to a non accessed device. Accordingly, the complete line need not be driven each time a device is accessed. As a result, power requirements of the data line are reduced.

Additional technical advantages of the present invention include providing faster access times to devices connected along a data line. In particular, the resistance and capacitance (RC) of the line is reduced by isolating a segment of the line. Accordingly, charge and discharge times of the line are reduced. Access times are further reduced by connecting frequently accessed devices to the data line proximate to the output. Accordingly, only a minimum segment of the line need be charged and discharged upon access of frequently accessed devices.

Other technical advantages of the present invention will be readily apparent to one skilled in the art from the following figures, descriptions, and claims.

BRIEF DESCRIPTION OF THE DRAWINGS

For a more complete understanding of the present invention and its advantages thereof, reference is now made to the following description taken in conjunction with the accompanying drawings, wherein like reference numerals represent like parts, in which.

DETAILED DESCRIPTION OF THE INVENTION

The preferred embodiments of the present invention and its advantages are best understood by referring now in more detail to FIGS. 1–5 of the drawings, in which like numerals refer to like parts. FIGS. 1–5 illustrate a low power line system in accordance with the present invention. As described in more detail below, the low power line system may comprise a line connecting a plurality of devices to an output. A switch may be disposed in the line to selectively disconnect a segment of the line connected to one or more of the devices from the output. Accordingly, the complete line need not be driven each time a device is accessed. As a result, power requirements of the line and access times to data along the line are reduced.

Figure 1:
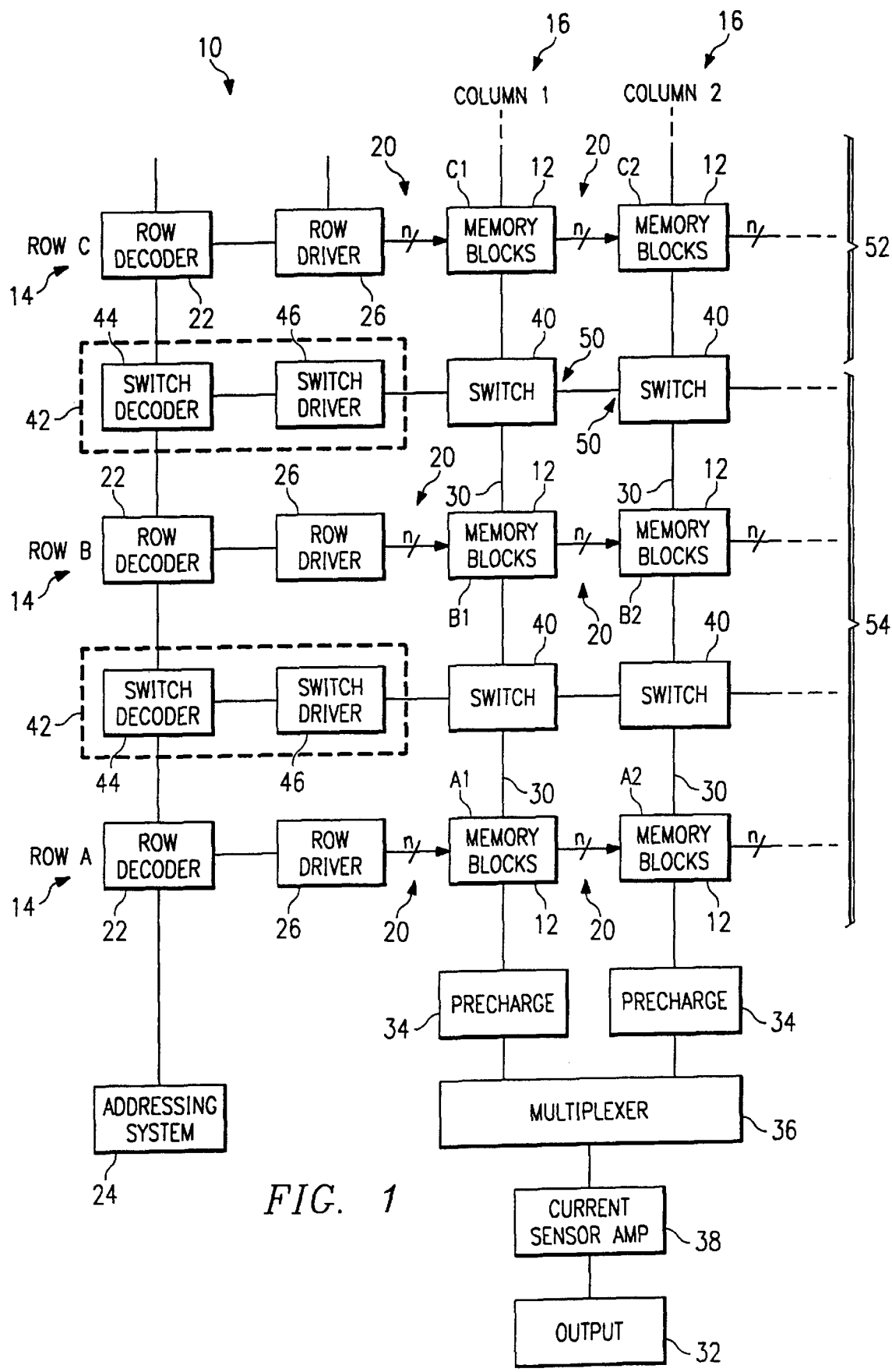
FIG. 1 is a block diagram illustrating a memory device comprising a low power line system in accordance with one embodiment of the present invention.

FIG. 1 illustrates a memory device 10 incorporating the low power line system of the present invention. In one embodiment, the memory device 10 may comprise a clocked read-only memory (ROM). It will be understood that the memory device 10 may comprise other types of memories within the scope of the present invention. For example, the memory device 10 may comprise a random access memory (RAM), a dynamic random access memory (DRAM), other types of read-only memories such as flash memory and the like.

The memory device 10 may comprise an array of memory blocks 12. As described in more detail below in connection with FIG. 2, the memory blocks 12 may each comprise a plurality of memory cells. The memory cells may be transistors formed in accordance with conventional integrated processing techniques or other types of memory devices.

The memory blocks 12 may be arranged in a series of rows 14 and columns 16. Exemplary rows A, B and C and columns 1 and 2 are shown for the memory device 10. It will be understood that the memory device 10 may comprise additional rows 14 and columns 16 of memory blocks 12 within the scope of the present invention. It will be further understood that the memory blocks 12 may be otherwise disposed relative to one another within the scope of the present invention.

Each row 14 of memory blocks 12 may be connected by a line 20. In one embodiment, the line 20 may comprise n separate lines, where n is the number of memory cells in each memory block 12. In this embodiment, each of the separate lines may comprise a word line connecting a row of memory cells in the memory blocks 12.

The line 20 may be any type of connector capable of transmitting signals. In one embodiment, the line 20 may comprise a conductor formed on a substrate in accordance with the conventional integrated circuit processing. It will be understood that the line 20 may comprise other types of connectors within the scope of the present invention.

The line 20 of each row 14 may be driven in accordance with conventional techniques. In one embodiment, a row decoder 22 may decode signals of an addressing system 24 and activate a row driver 26. The row driver 26 may drive the line 20 to access the memory cells of the memory blocks 12. For writable memory such as RAM, the row driver 26 may also drive the line 20 to store data in the memory cells of the memory blocks 12. It will be understood that the lines 20 may be otherwise driven within the scope of the present invention.

Each column 16 of memory blocks 12 may be connected to an output 32 by a data line 30. In one embodiment, the output 32 may be a line connected to a device utilizing the data of the memory device 10. It will be understood that the output 32 may be any type of device or a line of a device capable of using the data of the memory device 10.

As previously described in connection with the line 20, the line 30 may be any type of connector capable of transmitting signals. In one embodiment, the line 30 may comprise a conductor formed on a substrate in accordance with the conventional integrated circuit processing. It will be understood that the line 30 may comprise other types of connectors within the scope of the present invention.

The memory cells along each line 30 may be independently accessed to provide data to the output 32 along the line 30. For the clocked ROM embodiment of FIG. 1, a precharge 34, a multiplexer 36, and a current sensor amp 38 may be disposed in the line 30. The precharge 34 may precharge each line 30 of the memory device 10. Accordingly, data of a row of memory cells may be accessed by driving the line 20 of that row. As described in more detail below, the memory cells of the driven row may discharge or not depending upon their state.

The multiplexer 36 may receive data from a plurality of the lines 30 and construct a data word. In one embodiment, the data word constructed by the multiplexer 36 may have 2 bits of data. It will be understood that the multiplexer may construct data words having other numbers of bits within the scope of the present invention. For example, in one embodiment, the multiplexer 36 may construct data words of 8 bits, or one byte, each.

The data word formed by the multiplexer 36 may be read by the current sensor amp 38. The product of the current sensor amp 38 may be passed to the output 32. It will be understood that the lines 30 may be otherwise driven and/or read within the scope of the present invention.

In accordance with the present invention, one or more switches 40 may be disposed in the line 30. The switches 40 may each comprise a device operable to break or open an electrical circuit. As described in more detail below in connection with FIG. 3, the switch 40 may comprise a transistor formed in accordance with conventional integrated circuit processing techniques.

Each switch 40 may selectively disconnect a segment of the line 30 connected to at least one of the memory blocks 12 from the output 32. The switches 40 may be controlled by a switching system 42. The switching system 42 may actuate the switches 40 to disconnect the segments of the lines 30. Accordingly, the complete line 30 need not be driven each time one of the memory cells is accessed. In the clocked ROM embodiment of FIG. 1, the memory device 10 will only discharge the segment of the line 30 below the switch 40 to the output 32. The segments of the line 30 above the switch 40 retain their precharge state. This results in a faster access time and less of the precharge loss. Thus, power requirements of the line 30 and access times to data along the line 30 are reduced.

In one embodiment, the switching system 42 may comprise a switch decoder 44 and a switch driver 46. The switch decoder 44 may use the same decode scheme as the row drivers 26, except that its output would be active low. Thus, if the memory blocks 12 each included four (4) memory cells, the switch row driver 46 would use RA(n:2). Accordingly, memory blocks 12 in which a row of memory cells are selected would have the switches 40 above the blocks 12 actuated to disconnect the overhead segments of the line 30.

By way of example, if memory cells in blocks B1 and B2 are to be accessed, the switching system 42 may actuate switches 50 above blocks B1 and B2 to disconnect overhead segments 52 of the lines 30. Thus, the memory cells may be accessed without driving segments 52 of the lines 30. Memory cells of other memory blocks 12 may be similarly accessed. Accordingly, only the segment 54 of the line 30 between the accessed memory block 12 and the output 32 remains connected to the output 32.

The number and placement of switches 40 in the lines 30 may be varied within the scope of the present invention. For the embodiment of FIG. 1, the switches 40 may be evenly distributed in the line 30 between blocks 12 of four (4) memory cells each. It will be understood that the switches 10 may be otherwise distributed within the scope of the present invention.

Increasing the number of switches 40 in each of the lines 30 will divide the lines 30 into an increased number of sections between the switches 40. Power performance of the line 30 as a function of the number of sections may be shown by the following equation:

$$P_{ave} = \sum_{i=1}^{n} \left(\frac{i}{n}\right) P_{sec}$$

where:

$P_{ave}$ is an average power consumed driving the line;
$P_{sec}$ is a power consumed driving a section of the line; and
n is the number of sections in the line.

As n is increased, $P_{ave}$ will go toward one-half of the power consumed to drive the complete line. Accordingly, increasing the number of switches 40 in the line 30 will generally increase the power savings of the line 30. Due to the area and power requirements of the switches 40, however, it may be desirable to limit the number of switches 40. Accordingly, the optimum number of switches 40 will depend on the configuration of the memory device 10. The optimum number of switches 40 may generally be a balance between power savings, required area, cost of the switches 40 and density goals of the memory device 10. For the clocked ROM embodiment of FIG. 1, the sections may comprise blocks 12 of four (4) memory cells each.

In one embodiment, the switches 40 may be off when the line 30 is idle. Accordingly, the line 30 is initially segmented. In this embodiment, when a memory cell of the line 30 is accessed, the switches 40 between the accessed memory cell and the output 32 may be turned on to connect the accessed memory cell to the output. After access is complete, the switches 40 between the accessed memory cell and the output 32 may be turned back off.

In another embodiment, the switches 40 may be on when the line 30 is idle. Accordingly, the entire line 30 will be initially connected to the output 32. In this embodiment when a memory cell of the line 30 is accessed, the switch 40 above the block 12 of the accessed memory cell may be turned off to disconnect the above segment of the line 30 from the output 32. After access is complete, the switch 40 above the accessed memory cell may be turned back on. It will be understood that the switches 40 may be otherwise set within the scope of the present invention.

Figure 2:
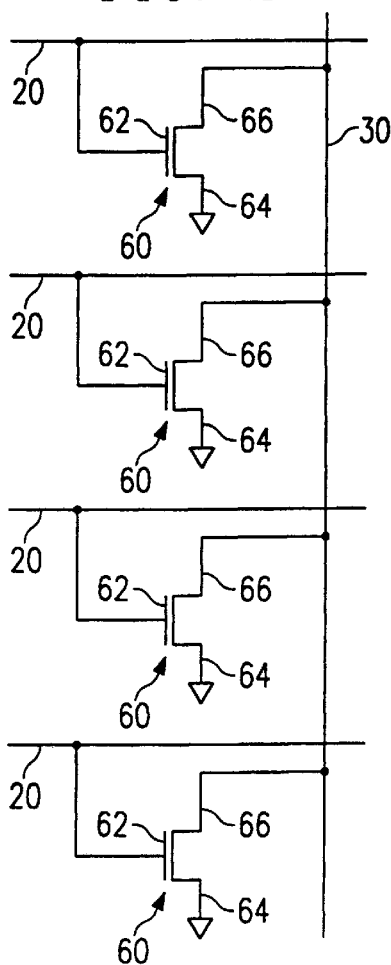
FIG. 2 is a detailed schematic diagram illustrating the memory cells of FIG. 1 in accordance with one embodiment of the present invention.

FIG. 2 is a schematic diagram illustrating memory cells 60 of the memory block 12 in accordance with one embodiment of the present invention. In this embodiment, the memory cells 60 may comprise field effect transistors formed in accordance with conventional integrated circuit processing techniques. It will be understood that the memory cells 60 may comprise other types of transistors or devices capable of storing data within the scope of the present invention.

Each memory cell 60 may have a gate 62, a source 64, and a drain 66. The gate 62 may be connected to one of the lines 20. The source 64 may be connected to ground. The drain 66 may be connected to one of the lines 30. In one embodiment, the memory cell 60 can be accessed by driving the lines 20 and 30 to which the memory cell 60 is connected. It will be understood that the memory cell 60 may be otherwise accessed within the scope of the present invention.

The memory cell 60 may have an ON and an OFF state. In one embodiment, the memory cell 60 may when accessed allow drive current to flow through the memory cell 60 in the ON state. In this embodiment, the memory cell 60 will not when accessed allow drive current to flow through memory cell 60 in the OFF state. It will be understood that the memory cell 60 may be otherwise configured within the scope of the present invention.

Figure 3:
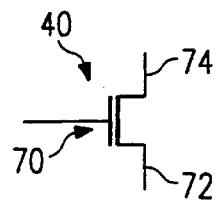
FIG. 3 is a detailed schematic diagram illustrating the switch of FIG. 1 in accordance with one embodiment of the present invention.

FIG. 3 illustrates a schematic diagram of the switch 40 in accordance with one embodiment of the present invention. In this embodiment, the switch 40 may comprise a field effect transistor formed in accordance with the conventional integrated circuit processing techniques. It will be understood that the switch 40 may comprise other types of devices capable of breaking or opening an electrical current within the scope of the present invention.

The switch 40 may comprise a gate 70, a source 72, and a drain 74. The gate 70 may be connected to the switching system 42. The source 72 and drain 74 may be connected to one of the lines 30. Accordingly, data from a memory cell 60 must pass through an underlying switch 40 to reach the output 32. It will be understood that the switch 40 may be otherwise connected to the line 30 and/or switching system 42 within the scope of the present invention.

The switch 40 may have high and low impedance states. In the low impedance state, the switch 40 may allow current to flow through the switch 40. Accordingly, the switch 40 will connect the overlying segment of the line 30 to the output. In the high impedance state, the switch 40 may not allow current to flow through the switch 40. Accordingly, the switch 40 will disconnect overlying segments of the line 30 from the output 32. It will be understood that the switch 40 may be otherwise configured within the scope of the present invention.

Figure 4:
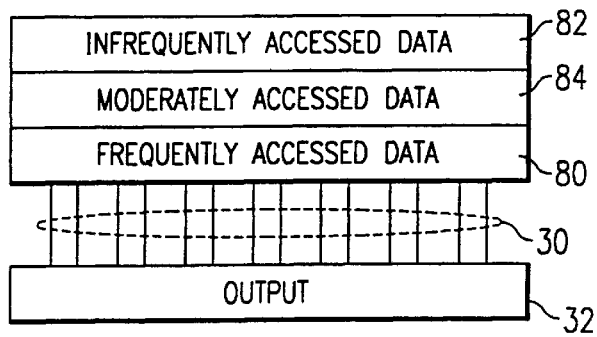
FIG. 4 is a block diagram illustrating the storage of frequently, moderately, and infrequently accessed data in the memory device of FIG. 1 in accordance with one embodiment of the present invention.

FIG. 4 illustrates the storage of frequently, moderately, and infrequently accessed data in the memory device 10 in accordance with one embodiment of the present invention. In this embodiment, frequently accessed data 80 may be stored in memory cells 60 connected to the line 30 proximate to the output 32. Infrequently accessed data 82 maybe stored in memory cells 60 connected to the line 30 distant of the output 32. Moderately accessed data 84 may be stored in memory cells 60 connected to the line 30 between the frequently accessed data 80 and the infrequently accessed data 82. In this arrangement, only a small section of the line 30 need be frequently driven when frequently accessed data 80 is accessed. Large sections of the line 30 are only infrequently driven when the infrequently accessed data 82 is accessed. Accordingly, power requirements of the line 30 and access times to data along the line 30 are further reduced.

Figure 5:
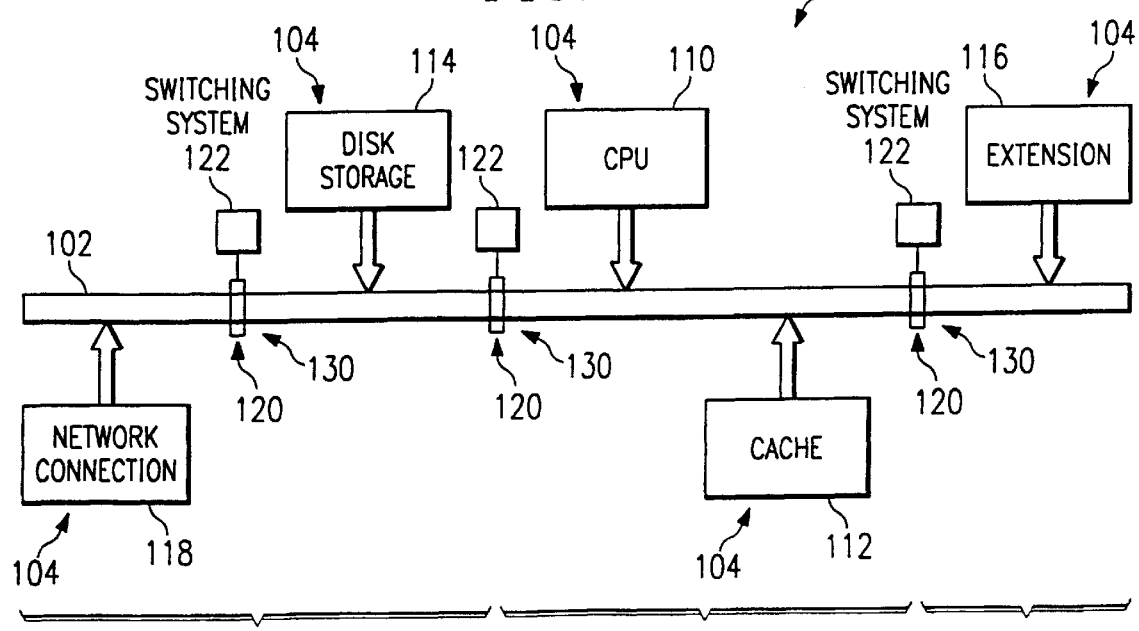
FIG. 5 is a block diagram illustrating a computing device comprising a low power line system in accordance with one embodiment of the present invention.

FIG. 5 illustrates a computing device 100 incorporating the low power line system of the present invention. In one embodiment, the computing device 100 may be a personal computer. It will be understood that the computer device 100 may comprise other types of computing devices within the scope of the present invention. For example, the computing device 100 may comprise a mainframe, a server, and the like.

The computing device 100 may comprise a data bus 102 connecting plurality of devices 104. Data bus 102 may be a set of lines that transfer data among the devices 104. In one embodiment, the data bus 102 may be a 16-bit data bus. In this embodiment, data bus 102 may transfer 16 bits of data between devices 104 at the same time. It will be understood that the data bus 102 may be otherwise configured within the scope of the present invention.

In one embodiment, the devices 104 may comprise a central processing unit (CPU) 110, a cache memory 112, a disk storage 114, an extension 116, and a network connection 118. It will be understood that the computing device 100 may comprise other or different devices 104 within the scope of the present invention. Each device 104 may be operable to be independently accessed to provide data to another, or output, device along the data bus 102.

In accordance with the present invention, one or more switches 120 may be disposed in the data bus 102. Each switch 120 may be any type of device operable to break or open an electrical circuit. In one embodiment, each switch 120 may extend across the entire data bus 102. The switches 120 may each selectively disconnect a segment of the data bus connected to at least one of the devices 104 from the output device.

The switches 120 may be controlled by a switching system 122. The switching system 122 may actuate the switches 120 to disconnect the segments of the data bus 102. Accordingly, the complete data bus 102 need not be driven each time one of the devices is accessed by another device. Thus, power requirements of the data bus 102 and access times to data along the data bus 102 are reduced.

The switching system 122 may comprise a conventional switch decoder 124 and switch driver 126. In one embodiment, the switch decoder 124 may decode addressing signals on the data bus 102 to determine the devices 104 between which data is to be transferred and appropriately actuate the switches 120. It will be understood that the switches 120 may be otherwise controlled within the scope of the present invention.

By way of example, if the CPU 110 is to access the cache memory 112, the switching system 122 may actuate switches 130 to disconnect segments 132 of the data bus 102. Thus, the CPU 110 may access the cache memory 112 without driving segments 132 of the data bus 102. Data may be similarly transferred between other devices 104 along the data bus 102.

The number and placement of the switches 120 in the data bus 102 may be varied within the scope of the present invention. For the embodiment of FIG. 5, the switches 120 may be positioned on either side of the CPU 110 and cache memory 112 connection, and thereafter between each device 104. It will be understood that the switches 120 may be otherwise distributed within the scope of the present invention.

Increasing the number of switches 120 in the data bus 102 will divide the data bus 102 into an increased number of sections between the switches 120. This will generally increase the power savings of the data bus 102. Due to the area and power requirements of the switches 120, however, it may be desirable to limit the number of switches 120. Accordingly, the optimum number and placement of the switches 120 will depend on the configuration of the computing device 100. The optimum number of switches may generally be a balance between power savings, required speed, cost of the switches 120, and density goals of the data bus 102.

In one embodiment, the switches 120 may be off when the data bus is idle. Accordingly, the data bus 102 is initially segmented. In this embodiment, when a device is accessed, the switches 120 between the access device and the output device may be turned on to connect the access device to the output device. After access is complete, the switches 120 between the access and output device may be turned back off.

In another embodiment, the switches 120 may be on when the data bus 102 is idle. Accordingly, all of the devices 104 are initially connected to one another along the data bus 102. In this embodiment, when a device is accessed, switches 120 immediately outward of a segment of the data bus 102 between the access device and output device may be turned off to disconnect the outward segments of the data bus 102. After access is complete, the switches 120 immediately outward of the segment of the data bus 102 between the access device and the output device may be turned back on. It will be understood that the switches 120 may otherwise set within the scope of the present invention.

Devices 104 frequently providing data to one another may be connected to the data bus 102 proximate to one another. For example, the CPU 110 and cache memory 112 may be connected to the data bus 102 proximate to one another. Accordingly, only a small section of the data bus 102 need be driven when data is exchanged between the CPU 110 and the cache memory 112. Accordingly, power requirements of the data bus 102 and access times to data along the data bus 102 are further reduced.

Additionally, frequently accessed devices 104 may be connected to a central segment 140 of the data bus 102. Frequently accessed devices may include the CPU 110 and the cache memory 112. In this embodiment, infrequently accessed devices may be connected to the data bus 102 outwardly of the central segment 140. Infrequently accessed devices may include disk storage 114, extensions 116, and the network connection 118. It will be understood that disk storage 114, extensions 116, and network connection 118 may be frequently accessed devices in other computer configurations. In such configurations, such devices 104 may be part of or proximate to the central segment 140 of the data bus 102.

Although the present invention has been described with several embodiments, various changes and modifications may be suggested to one skilled in the art. It is intended that the present invention encompass such changes and modifications as fall within the scope of the appended claims.

What is claimed is:

1. A low power data line, comprising:

a line;

an output;

a plurality of devices serially connected by said line to said output;

said devices operating to be interdependently accessed to provide data to the output along the line; and a plurality of selectively operable switches disposed in said line, each switch disposed between a different pair of said devices, each of said switches being selectively operable to selectively disconnect the segment of said line connected to the operated switch and extending in a direction therefrom away from said output.

2. The power data line of claim 1, further comprising:

a switching system coupled to said switches;

the switching system operable to control said switches to selectively disconnect the segment of the line from the output.

3. The power data line of claim 1, further comprising:

a second segment of the line opposite the first segment of the line;

the second segment of the line connected to at least one of the devices; and the switching system operable to control the switches to selectively disconnect the second segment of the line from the output.

4. The power data line of claim 1, the switch further comprising a transistor.

5. The power data line of claim 1, the switch further comprising a field effect transistor.

6. The power data line of claim 1, each device further comprising a set of memory cells.

7. The power data line of claim 1, further comprising the output being one of the devices coupled to the line.

8. A memory device, comprising:

a plurality of memory cells;

a first line serially connecting said plurality of memory cells to an output;

a plurality of second lines, each operable to access one of said memory cells to provide data to the output along the first line; and a plurality of selectively operable switches disposed in said first line, each switch disposed between a different pair of said memory cells, each of said switches being selectively operable to selectively disconnect the segment of said first line connected to the operated switch and extending in a direction therefrom away from said output.

9. The memory device of claim 8, further comprising:

a switching system coupled to the plurality of switches; and the switching system operable to control the switches to selectively disconnect one of the segments of the line from the output.

10. The memory device of claim 8, further comprising frequently accessed data stored in memory cells connected to the first line proximate to the output.

11. The memory device of claim 10, further comprising infrequently accessed data stored in memory cells connected to the first line distant of the output.

12. The memory device of claim 8, the first line further comprising a bit line.

13. A computing device, comprising:

a plurality of devices and an output device;

a data bus serially connecting said plurality of devices to said output device;

the plurality f devices operable to be independently accessed to provide data to said output device along the data bus; and a plurality of selectively operable switches disposed in said data bus, each switch disposed between a different pair of devices, each of said switches being selectively operable to selectively disconnect the segment of said data bus connected to the operated switch and extending in a direction therefrom away from said output device.

14. The computing device of claim 13, further comprising:

a switching system coupled to said switches; and the switching system operable to control said switches to selectively disconnect the segment of the data bus from the output.

15. The computing device of claim 13, the devices further comprising a central processing unit, a cache memory, and a device selected from a group comprising: disk storage, an extension, and a network connection.

16. The computing device of claim 13, further comprising devices frequently providing data to one another connected to the data bus proximate to one another.

17. The computing device of claim 13, further comprising a plurality of frequently accessed devices connected to a central segment of the data bus.

18. The computing device of claim 17, further comprising an infrequently accessed device connected to the data bus outwardly of the central segment of the data bus.

19. The computing device of claim 17, the frequently accessed devices further comprising a central processing unit and a cache memory.

20. A method of connecting a plurality of devices to an output, comprising the steps of:

providing a plurality of devices, a data line and an output;

connecting said plurality of devices serially in said data line;

connecting the data line to an output;

disposing a plurality of selectively operable switches in the data line, each switch disposed between a different pair of devices, each of said switches being selectively operable to selectively disconnect the segment of the line connected to the operated switch and extending in a direction therefrom away from the output.

21. The method of claim 20, further comprising the steps of identifying frequently selected data from an assemblage of data and storing said frequently accessed data in devices connected to the data line more proximate to the output than the remainder of said assemblage of data.

22. The method of claim 21, further comprising the step of storing infrequently accessed data in devices connected to the data line distant of the output.

* * * * *